US009356593B2

(12) United States Patent  
Pan et al.

(10) Patent No.: US 9,356,593 B2  
(45) Date of Patent: May 31, 2016

(54) DISTRIBUTED VIRTUAL-GROUND SWITCHING FOR SAR AND PIPELINED ADC

(71) Applicant: Broadcom Corporation, Irvine, CA (US)

(72) Inventors: Hui Pan, Coto De Caza, CA (US); Karim Abdelhalim, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/266,465

(22) Filed: Apr. 30, 2014

(65) Prior Publication Data

US 2015/0311913 A1   Oct. 29, 2015

Related U.S. Application Data

(60) Provisional application No. 61/985,298, filed on Apr. 28, 2014.

(51) Int. Cl.
*H03M 1/12* (2006.01)
*H03K 17/08* (2006.01)
*H03M 1/38* (2006.01)
*H03M 1/16* (2006.01)
*H03M 1/46* (2006.01)

(52) U.S. Cl.
CPC ............. *H03K 17/08* (2013.01); *H03M 1/1245* (2013.01); *H03M 1/38* (2013.01); *H03M 1/168* (2013.01); *H03M 1/468* (2013.01)

(58) Field of Classification Search
CPC ..... H03M 1/38; H03M 1/403; H03M 1/1245; H03M 1/168; H03K 17/08

USPC .......................................... 341/155, 120, 161
See application file for complete search history.

(56) References Cited

U.S. PATENT DOCUMENTS

| | | | | | |
|---|---|---|---|---|---|
| 4,962,325 | A | * | 10/1990 | Miller | H03F 1/303 327/65 |
| 6,054,886 | A | * | 4/2000 | Opris et al. | 327/304 |
| 6,621,445 | B1 | * | 9/2003 | Thilenius | 341/172 |
| 6,801,186 | B2 | * | 10/2004 | Han et al. | 345/103 |
| 8,610,046 | B2 | * | 12/2013 | Van Blerkom | 250/214 P |
| 9,160,575 | B1 | * | 10/2015 | Lin | H04L 25/03019 |

OTHER PUBLICATIONS

Venes et al., "An 80MHz 80mW 8b CMOS Folding A/D Converter with Distributed T/H Preprocessing", ISSCC, 1996, 3 pages.

* cited by examiner

*Primary Examiner* — Brian Young  
(74) *Attorney, Agent, or Firm* — Fiala & Weaver P.L.L.C.

(57) ABSTRACT

Systems, apparatuses, and methods are provided for analog-to-digital converters (ADCs), such as successive-approximation-register (SAR) ADCs and pipelined ADCs that utilize distributed virtual-ground switching (DVS). DVS circuits and systems receive reference signal inputs that are provided to input signal buffers at the input side of the buffers via reference switches. The input signal buffers and corresponding switches are distributed into scaled replicas that each receive an analog input signal via input signal switches during a first operational phase and are connected to top plates of corresponding distributed capacitors. The bottom plates of the capacitors are sampled to provide analog input signal representations. Based on the value of the signal representations, a state machine controls each of the switches to apply reference signals to the input buffers, during a second operation phase, and to iteratively generate additional signal representations and provide a digital signal that corresponds to the analog input signal.

20 Claims, 8 Drawing Sheets

DISTRIBUTED VIRTUAL-GROUND SWITCHING FOR SAR AND PIPELINED ADC

CROSS-REFERENCE TO RELATED APPLICATIONS

This application claims priority to U.S. Provisional Patent Application No. 61/985,298, filed Apr. 28, 2014, and entitled "Distributed Virtual-Ground Switching for SAR and Pipelined ADC," the entirety of which is incorporated by reference herein.

BACKGROUND

1. Technical Field

The subject matter described herein relates to systems, apparatuses, and methods for distributed virtual-ground switching for successive-approximation-register (SAR) and pipelined analog-to-digital converters (ADCs).

2. Background Art

Communication technologies, such as networking, broadband, and wireless communications, often utilize switched capacitor circuits with analog-to-digital converters (ADCs), such as successive-approximation-register (SAR) ADCs and pipelined ADCs. SAR ADCs typically include a signal buffer, an input switch driven by a voltage (e.g., VDD) at the output of the signal buffer, and a number (n=1, 2, 3, . . . ) of signal-driven capacitors with bottom-plate reference switches. One conventional implementation of a SAR ADC uses a thick-oxide metal oxide semiconductor field effect transistor (MOSFET) input switch, with relatively slow performance, at the output of the signal buffer. These MOSFETs have their gate voltages "bootstrapped" (e.g., using a charged capacitor to raise the gate voltage) during the tracking phase to help reduce voltage headroom and linearity issues, but this configuration suffers from several drawbacks. For instance, overvoltage issues persist especially as the manufacturing process scales down toward 16 nm. Smaller scale processes suffer reversed junction leakage and breakdown at drain-to-body voltage Vdb>VDD, and portability suffers due to process dependence and design complexity. In addition to area and power overhead, performance also suffers due to increased parasitics, switching activities, etc. Further, without "bootstrapping," an additional power supply must be provided at a higher voltage for the thick oxide MOSFET gate (e.g., twice VDD).

BRIEF SUMMARY

Systems, apparatuses, and methods are described for distributed virtual-ground switching (DVS) for SAR ADCs and pipelined ADCs, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. The left-most digit(s) of a reference number identifies the drawing in which the reference number first appears.

DETAILED DESCRIPTION

1. Introduction

Figure 1:
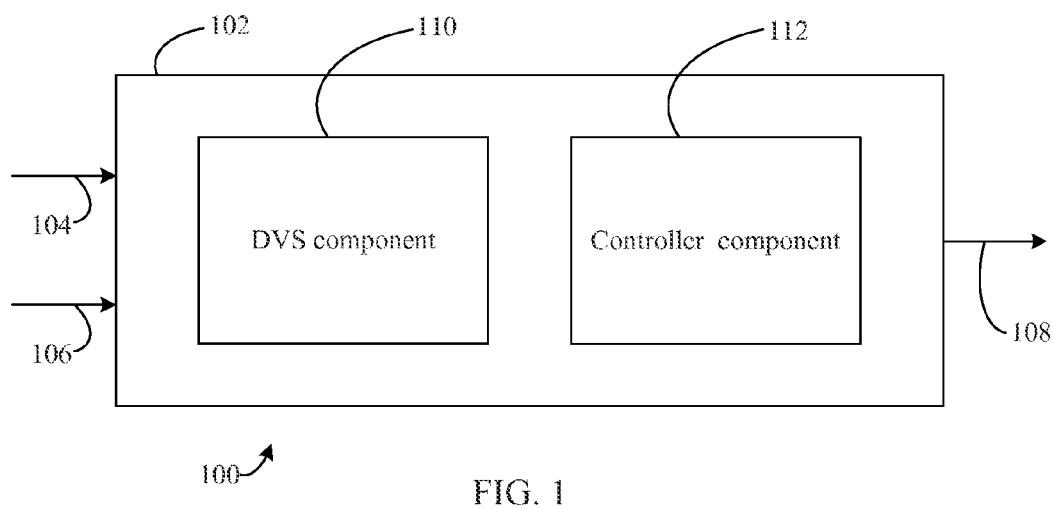
FIG. 1 is a block diagram of a portion of a distributed virtual-ground switching system, according to an exemplary embodiment.

The present specification discloses numerous example embodiments. The scope of the present patent application is not limited to the disclosed embodiments, but also encompasses combinations of disclosed embodiments, as well as modifications to disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," and "approximately" may be used interchangeably and are intended to convey the same meaning. Further, the terms "VDD" and "GND" are used herein to refer to operating voltage and ground signals respectively, though other reference voltages than ground may be used in some embodiments.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Numerous exemplary embodiments are now described. Any section/subsection headings provided herein are not intended to be limiting. Embodiments are described throughout this document, and any type of embodiment may be included under any section/subsection. Furthermore, disclosed embodiments may be combined with each other in any manner.

2. Example Embodiments

The embodiments described herein may be adapted to distributed virtual-ground switching (DVS) for successive-approximation-register (SAR) analog-to-digital converters (ADCs) and pipelined ADCs which may be used in various types of computing systems, communication systems, communication devices, electronic devices, and/or the like. The embodiments described herein may be configured in various ways to perform their respective functions. While described in the context of SAR and pipeline ADCs, the inventive techniques herein may also be applicable to other types of ADCs. The described embodiments may refer to particular types of buffers, switches, capacitors, amplifiers, etc., although the inventive techniques provided herein may be applicable to other types of these components not explicitly mentioned. Furthermore, additional structural and operational embodiments, including modifications and/or alterations, will become apparent to persons skilled in the relevant art(s) from the teachings herein.

Generally, in the embodiments herein, an analog signal is received as an input and a corresponding digital signal is provided as an output. The analog signal may be input during a tracking phase, and a corresponding digital signal may me generated and/or determined during a conversion phase. The digital signal may be represented as n bits, where n is a positive integer and may be implementation specific depending on system limitations and/or desired signal resolution.

To overcome one or more of the issues associated with traditional solutions, the described embodiments may divide (i.e., distribute) a signal buffer and an input switch into a number of replicas (n) according to reference switches and capacitors. For instance, embodiments may include a number of input signal switches, a number of reference signal switches, a number of signal buffers, and a number of capacitors (e.g., in groups and/or arrays). The analog input signal may be received and provided to the signal buffers (e.g., at inverting input terminals) through a number of signal input switches, and the reference signal switches may provide one or more reference signals to the signal buffers (e.g., at the inverting input terminals or at non-inverting input terminals). That is, rather than having capacitor bottom-plate reference switches, as in traditional solutions, the embodiments herein may provide for references switches located at the input(s) of the distributed signal buffers. The signal buffers provide buffered signals to the top plates of the capacitors, and the bottom plates of the capacitors provide an output signal according to a bottom plate sampling switch. This output signal, or a representation thereof, may be provided to a controller (e.g., a state machine), and to a comparator (e.g., in exemplary SAR ADC embodiments) or to an OTA (operational transconductance amplifier) and one or more ADCs (e.g., in exemplary pipelined ADC embodiments). Based on a switch controller signal and a phase of operation, the analog input signal and/or the reference signal(s) may be provided to the respective distributed signal buffers and capacitors, and through an iterative SAR process for each of the n bits, described in further detail below, a digital signal representation of the analog input may be generated.

Each buffer replica may be scaled to be proportional in size to the capacitor being driven by the replica, and each capacitor may be sized according to $2^{(i-1)}C_0$, for i=1 to n, where n is the number of replicas (n=1, 2, 3, . . . ), and where $C_0$ is the capacitance of the capacitor of the least significant bit (LSB) of the digital signal representation of the analog input. The capacitance of the capacitor of the most significant bit (MSB) of the digital signal representation of the analog input is $2^{(n-1)}C_0$. Each signal buffer of the signal buffer array corresponding to a respective capacitor of the capacitor array is scaled according to a ratio of $C_i/\Sigma C_{0 \ldots n-1}$, where $C_i$ is the capacitance of its corresponding respective capacitor and $\Sigma C_{0 \ldots n-1}$ is the sum of the capacitances of all capacitors in the capacitor array. The described distributed buffering isolates the top plates of the capacitors preventing interference of a traditional single buffer output with the top plate voltages during toggling of the bottom-plate reference switches.

The embodiments herein also provide for distributing the bottom-plate reference switches among the virtual ground inputs of the corresponding replica signal buffers, and connecting (i.e., shorting) together the bottom plates of the capacitors as a negative output with the negative output being coupled to ground through a bottom-plate sampling switch. Such a configuration eliminates any buffer offset effect of the distributed replica buffers, and, through the use of an op-amp, gain mismatch among the distributed replica buffers is negligible. In some SAR ADC embodiments, area overhead can be avoided by applying the described distribution to only outputs of the most significant bits.

Additional implementation options and/or variations are also described herein, according to embodiments. For instance, the reference switches can be placed on the non-inverting input side of the signal buffer. The feedback factor is higher in the conversion phase for such configurations, and the op-amp may be configured and/or selected to tolerate larger input common mode (CM) range. In one example embodiment, reference voltages can drive the capacitors directly during the conversion phase with the signal buffers powered down and switched to a high impedance configuration. This allows a low power reference scheme to save power and eliminate the gain matching requirement noted above. In embodiments where switches are implemented as MOSFETs (or the like), the buffer output can also be set to high impedance in the conversion phase by shorting the output PMOS and NMOS gates to VDD and GND, respectively. Still further, a variation-matching switch can be added in the buffer feedback path to cancel the gain variation by matching the impedance of the buffer feedback path to the input switch path.

It is contemplated that a virtual ground SAR ADC switching implementation may be used to solve some of the issues with traditional solutions noted above by including the input switch at the input side of the signal buffer. However, this configuration of virtual ground switching cannot readily be applied to SAR ADC solutions because the buffer output interferes with the top plate voltage of the capacitors when the bottom plates are switched to different reference voltages.

The embodiments described herein may be configured in various ways to perform their respective functions. For example, FIG. 1 shows a block diagram of a portion of a system 100 that may be applied to SAR and pipeline ADCs, in embodiments. System 100 is configured to receive an analog input signal and to provide a digital output representation of the analog signal using DVS SAR techniques, according to embodiments described herein. For instance, system 100 includes an ADC component 102 that takes an analog input signal 104 corresponding to a received analog signal and a reference signal input 106 corresponding, e.g., to a reference voltage or virtual ground, as inputs, and that provides a digital output signal 108 as an output. As illustrated, ADC component 102 includes a DVS component 110 and a controller component 112.

DVS component 110 may include a distributed number (n) of signal switches, reference switches, signal buffers, and/or capacitors (described in further detail below). DVS component 110 is configured to provide a representation of analog input signal 104 to controller component 112 through an n-bitwise, iterative SAR technique. In embodiments, n corresponds to a number of digital bits to be associated with analog input 104. DVS component 110 is configured to receive analog input signal 104 and reference signal input 106 at each of the distributed signal buffers through respective signal switches and reference switches, and to provide the voltages of analog input signal 104 and reference signal input 106 at the top plates of the distributed capacitors. The bottom plates of the distributed capacitors provide a negative representation of received voltages to controller component 112.

Controller component 112 may include a state machine (or similar type of controller and/or memory). In embodiments, controller component 112 may include a comparator. In some embodiments, controller component 112 may include an amplifier (e.g., an operational transconductance amplifier (OTA)) and one or more ADC components. Controller component 112 is configured to control the activation of switches in DVS component 110 via the state machine using the negative representations, and to provide digital output signal 108.

Figure 2:
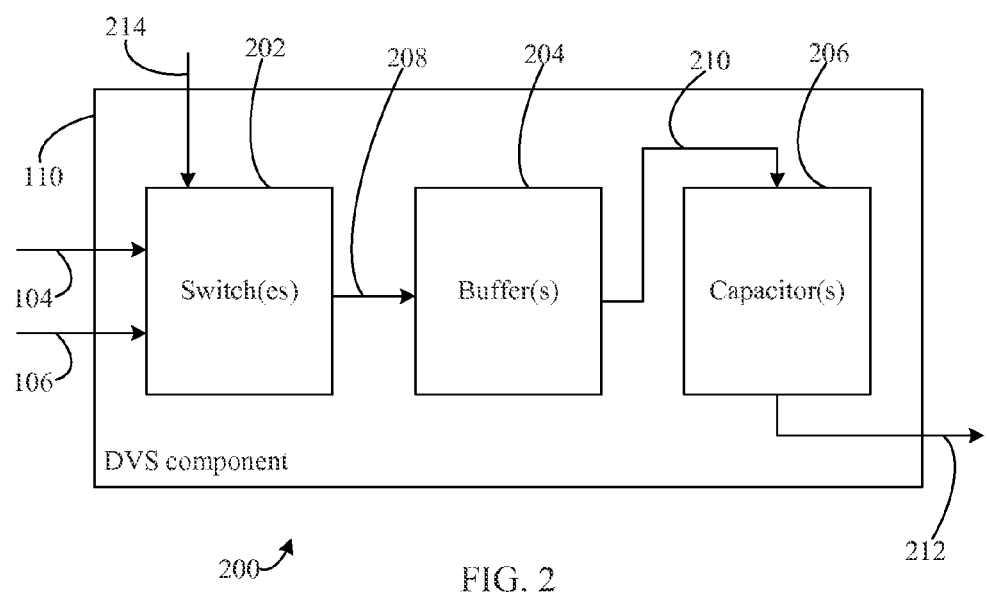
FIG. 2 is block diagram of a portion of a distributed virtual-ground switching system, according to an exemplary embodiment.

FIG. 2 shows a block diagram of a system 200. As shown, according to an embodiment, system 200 may be a portion of DVS component 110 of FIG. 1. System 200 includes one or more switches 202, one or more buffers 204, and one or more capacitors 206. As similarly described above, system 200 is configured to provide an n-bit representation of an analog input signal. Switches 202 receive analog input signal 104 and reference signal input 106, and provide switched signals 208 (i.e., analog input signal 104 and/or reference signal input 106) to buffers 204 according to switch control signal 214 from controller component 112 (described in further detail below). Buffers 204 provide a buffered analog input signal 104 and/or reference signal input 106 to the top plates of capacitors 206. The bottom plates of capacitors 206 provide a signal representation 212 to controller component 112.

Switches 202 may be implemented as MOSFET switches (e.g., pMOS and/or nMOS FETs) according to some embodiments and/or may be implemented as any other type of switch in other embodiments. Switches 202 may be implemented as a group or array of distributed switches that correspond to each distributed buffer of buffers 204 and to each distributed capacitor of capacitors 206. Switches 202 may include a number (e.g., n) of distributed switches associated with an analog input signal (e.g., 104) as well as a number of distributed switches associated with one or more reference signal inputs (e.g., 106). The operation of switches 202 may be controlled via a control signal (e.g., switch control signal 214) received from controller component 112. For instance, one or more of switches 202 may be opened or closed according to switch control signal 214, which may in embodiments, correspond to operational phases of system 200.

Buffers 204 may be implemented as any inverting or non-inverting analog signal buffer, according to various embodiments. Buffers 204 may each have an output and one or more inputs such as an inverting input terminal and/or a non-inverting input terminal. Buffers 204 may be implemented as a group or array of distributed buffers. In an embodiment, buffers 204 may be implemented as operational amplifiers.

Capacitors 206 may be implemented as any type of capacitor and may be implemented as a group or array of distributed capacitors. Capacitors 206 are configured to receive signals from corresponding buffers of buffers 204 at their respective top plates, and to provide signals to controller component 112 from their respective bottom plates. In embodiments, the bottom plates of capacitors 206 may be connected together.

The techniques and embodiments described herein provide for improvements in input bandwidth and voltage swing, improved common mode range, device reliability and efficiency, and reduced capacitor array routing for devices, while eliminating signal buffer interference.

As noted, methods, systems, and apparatuses are provided for distributed virtual-ground switching for SAR and pipelined ADCs. In an example aspect, a circuit is disclosed that includes a first capacitor, a first switch, and a first signal buffer. The first capacitor has a first top plate and a first bottom plate, and the first capacitor is configured to drive an output signal from the first bottom plate. The first switch has a first terminal configured to receive an input signal and has a second terminal configured to provide the input signal according to a control signal. The first signal buffer has a first output terminal communicatively coupled to the first top plate and has a first input terminal communicatively coupled to the second terminal of the first switch.

Note that the references to "top" plate and "bottom" plate herein are not intended to refer to an actual physical orientation of capacitor plates, but to distinguish the plates from each other for purposes of illustration. The "top" plate and "bottom" plate may also be referred to as a "first" plate and a "second" plate, respectively, or may be referred to in another manner. The top and bottom plates of the capacitor are electrical conductors (e.g., metals such as aluminum foils, etc.), that are separated by a dielectric (an electrical insulator such as glass, plastic, air, paper, etc.) of the capacitor.

In another example aspect, a system is disclosed that includes a capacitor array, a plurality of switch groups, and a signal buffer array. Each capacitor of the capacitor array has a top plate and has a bottom plate configured to drive an output signal. Each switch group corresponds to a respective capacitor of the capacitor array, and includes a first switch configured to provide an input signal, a second switch configured to provide a first reference voltage signal, and a third switch configured to provide a second reference voltage signal. Each signal buffer of the signal buffer array corresponds to a respective capacitor of the capacitor array and to a respective switch group of the plurality of switch groups. Each signal buffer includes an output terminal communicatively coupled to the top plate of the corresponding respective capacitor, and a first input terminal communicatively coupled to each switch of the corresponding respective switch group.

In yet another example aspect, a method is disclosed. The method includes receiving during a first phase of a control signal, by a plurality of signal buffers, an input data signal through a plurality of switches, each signal buffer of the plurality of signal buffers receiving the input data signal from a respective switch of the plurality of switches, and receiving during the first phase of the control signal, by a top plate of each of a plurality of capacitors, a buffered data signal generated from the input data signal by a corresponding signal buffer of the plurality of signal buffers, the bottom plate of each of the plurality of capacitors being coupled to a first reference voltage. The method also includes decoupling the bottom plates from the first reference voltage during the first phase of the control signal subsequent to receiving the buffered data signal. The method further includes receiving during a second phase of the control signal, by the top plate of each of the plurality of capacitors, a buffered data signal generated from one of a second or a third reference voltage by a corresponding signal buffer of the plurality of signal buffers, and comparing, by a comparator, a plurality of output signals from bottom plates of the plurality of capacitors to a fourth reference voltage to generate a first digital output bit during the second phase of the control signal. Still further, the method includes selecting one of the second and third references voltages to apply to an input of a first signal buffer of the plurality of signal buffers based on the generated first digital output bit, and generating during the second phase of the control signal, by the first signal buffer, a corresponding first buffered data signal based on the selected one of the second and third reference voltages, the first buffered data signal received by the top plate of a corresponding capacitor of the plurality of capacitors. The method also includes receiving during the first phase of the control signal, by the top plate of each of a plurality of capacitors, the buffered data signal generated by the corresponding signal buffer of the plurality of signal buffers, and comparing, by the comparator, the plurality of output signals from the bottom plates of the plurality of capacitors to the fourth reference voltage to generate a second digital output bit during the second phase of the control signal.

Various example embodiments are described in the following subsections. In particular, example embodiments for DVS circuits are described, followed by example SAR ADC embodiments and example pipeline ADC embodiments. This is followed by a description of example DVS circuit variation embodiments, and then example operational embodiments are subsequently described. Next, further DVS example embodiments and advantages are described. Finally, some concluding remarks are provided.

3. Example DVS Circuit Embodiments

In embodiments, DVS circuits are provided for SAR ADC systems and pipelined ADC systems. As noted above, e.g., with respect to FIGS. 1-2, a DVS component may provide a representation of an analog signal to be converted into a digital signal representation. In embodiments, DVS circuits may be configured in various ways.

Figure 3:
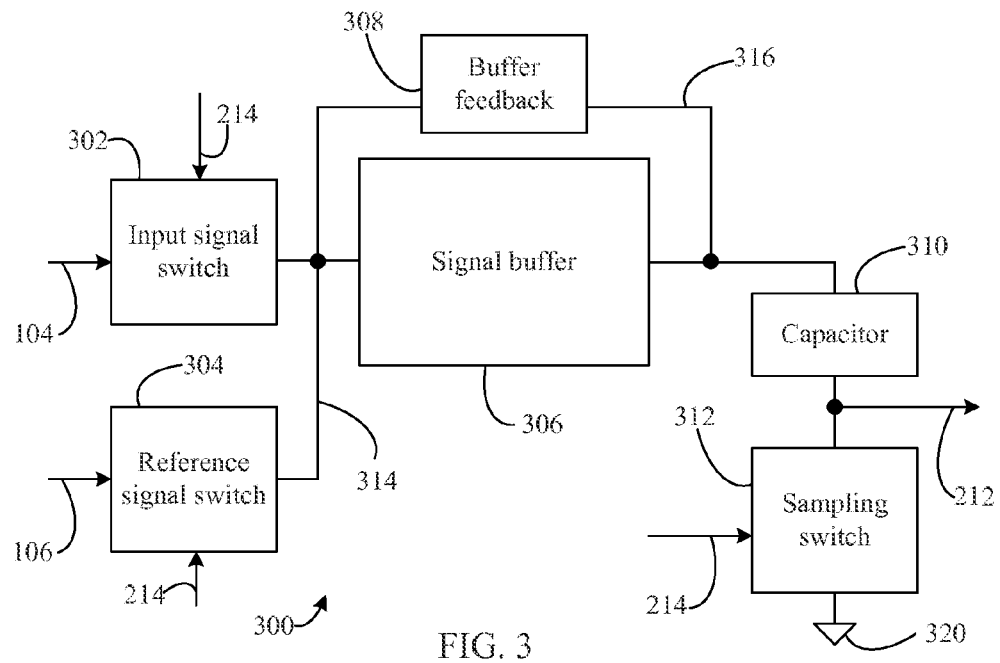
FIG. 3 is a block diagram of a portion of a distributed virtual-ground switching circuit, according to an exemplary embodiment.

For example, distributed signal buffer replicas with input-side reference switches may be utilized in embodiments. Such configurations isolate the top plates of capacitors in DVS circuits and prevent interference from a signal buffer output. A number n of replicas may be implemented in DVS circuits, according to embodiments. FIG. 3 shows a block diagram of a portion of a DVS circuit 300, according to an exemplary embodiment. DVS circuit 300 may be a further embodiment of DVS component 110 of FIG. 1 and/or of system 200 of FIG. 2. DVS circuit 300 represents a replica or slice of an overall DVS circuit along with a sampling switch as may be used in SAR ADC or pipelined ADC embodiments. DVS circuit 300 includes an input signal switch 302, a reference signal switch 304, a signal buffer 306, a buffer feedback component 308, a capacitor 310, and a sampling switch 312. In embodiments, input signal switch 302 and reference signal switch 304 may be further embodiments of switches 202 as shown in FIG. 2.

As illustrated, DVS circuit 300 receives analog input signal 104 at input signal switch 302, and receives reference signal input 106 at reference signal switch 304. Input signal switch 302 and reference signal switch 304 are controlled by switch control signal 214, as described with respect to FIG. 2. Analog input signal 104 and reference signal input 106 are provided on buffer input 314 to signal buffer 306 which provides buffer output 316 to buffer feedback component 308 and to the top plate of capacitor 310. Buffer feedback component 308 is also connected to buffer input 314. The bottom plate of capacitor 310 is connected to signal representation 212 and to sampling switch 312. Sampling switch 312 provides a connection between the bottom plate of capacitor 310 and a ground signal GND 320, and is controlled by switch control signal 214.

Input signal switch 302 and reference signal switch 304 may be implemented as MOSFETs, as similarly described with respect to switches 202 in FIG. 2, according to embodiments. Input signal switch 302 and reference signal switch 304 are controlled by switch control signal 214 which may be generated by control component 112 of FIG. 1, and may be associated with an operating phase(s) of DVS circuit 300. Switch control signal 214 may include a respective control signal for each of input signal switch 302 and reference signal switch 304, and each switch may be controlled independently of the other. When active (i.e., closed) input signal switch 302 and reference signal switch 304 provide their respective outputs to signal buffer 306, and when inactive (i.e., open) input signal switch 302 and reference signal switch 304 act as open circuits.

Signal buffer 306 may be implemented as any inverting or non-inverting analog signal buffer, according to various embodiments. Signal buffer 306 may include an output and one or more inputs such as an inverting input terminal and/or a non-inverting input terminal Signal buffer 306 may be one of a group or array of distributed buffers.

Buffer feedback component 308 may be implemented as any type of impedance element (e.g., a resistor or any other impedance element) and is configured to provide a feedback path to set the gain for signal buffer 306 according to an impedance R associated with the signal path of analog input signal 104 and/or of reference signal input 106. The impedance of feedback component 308 may be implemented according to design and/or gain preference. In some embodiment, buffer feedback component 308 may include a variation-matching switch as described above.

Capacitor 310 may be implemented as any type of capacitor and may be implemented as one of a group or array of distributed capacitors. Capacitor 310 is configured to receive a signal from signal buffer 306 at its top plate, and to provide signal representation 212 to controller component 112 from its bottom plate.

Sampling switch 312 may be implemented as a MOSFET, as described herein, or any other equivalent switching component. Sampling switch 312 is controlled by switch control signal 214 which may be generated by control component 112 of FIG. 1, and may be associated with an operating phase(s) of DVS circuit 300. When active (i.e., closed) sampling switch 312 connects the bottom plate of capacitor 310 to GND 320, and when inactive (i.e., open) sampling switch 312 acts as an open circuit. Switch control signal 214, in the embodiments herein, may include one or more phase control signals for one or more switches which are controlled by switch control signal 214.

Figure 4:
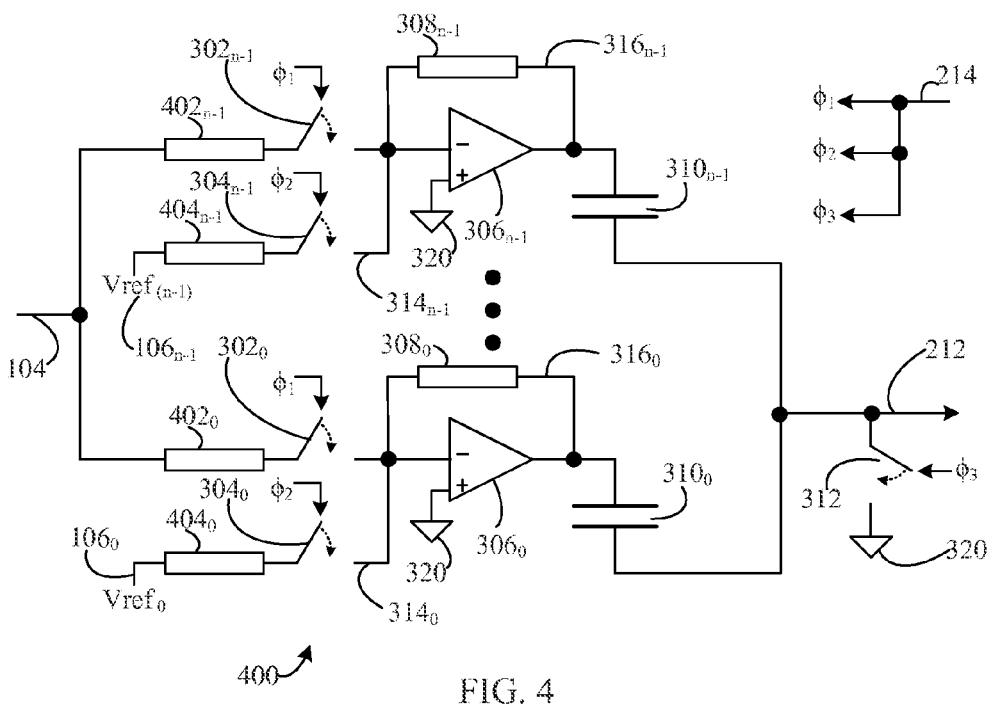
FIG. 4 is a circuit diagram of a portion of a distributed virtual-ground switching circuit, according to an exemplary embodiment.

FIG. 4 shows a circuit diagram of a DVS circuit 400. DVS circuit 400 may be a further embodiment of DVS circuit 300 of FIG. 3. That is, DVS circuit 400 includes a plurality of distributed replica buffers as described with respect to DVS circuit 300. As illustrated, DVS circuit 400 shows a plurality n of distributed replicas. DVS circuit 400 includes a plurality of input signal switches $302_0$-$302_{n-1}$, a plurality of reference signal switches $304_0$-$304_{n-1}$, a plurality of signal buffers $306_0$-$306_{n-1}$, a plurality of buffer feedback components $308_0$-$308_{n-1}$, a plurality of capacitors $310_0$-$310_{n-1}$, and sampling switch 312. As noted above, n replicas are included to represent an n-bit digital signal representation of an analog input signal. DVS circuit 400 also includes a plurality of impedance elements $402_0$-$402_{n-1}$ and a plurality of impedance elements $404_0$-$404_{n-1}$.

As shown in FIG. 4, analog input signal 104 is received by input signal switches $302_0$-$302_{n-1}$ respectively through impedance elements $402_0$-$402_{n-1}$. Reference signal inputs $106_0$-$106_{n-1}$ are received by reference signal switches $304_0$-$304_{n-1}$ respectively through impedance elements $404_0$-$404_{n-1}$. Input signal switches $302_0$-$302_{n-1}$ and reference signal switches $304_0$-$304_{n-1}$ are controlled by switch control signal 214, as described with respect to FIG. 2, which in embodiments may comprise a plurality of respective control signal portions. Analog input signal 104 and reference signal inputs $106_0$-$106_{n-1}$ are respectively provided on buffer inputs $314_0$-$314_{n-1}$ to signal buffers $306_0$-$306_{n-1}$ (at inverting input terminals) which respectively provide buffer outputs $316_0$-$316_{n-1}$ to buffer feedback components $308_0$-$308_{n-1}$ and to the top plates of capacitors $310_0$-$310_{n-1}$. Non-inverting input terminals of signal buffers $306_0$-$306_{n-1}$ are connected to GND 320. Buffer feedback components $308_0$-$308_{n-1}$ are also respectively connected to buffer inputs $314_0$-$314_{n-1}$. The bottom plates of capacitors $310_0$-$310_{n-1}$ are connected to signal representation 212 and to sampling switch 312. Sampling switch 312 provides a connection between the bottom plates of capacitors $310_0$-$310_{n-1}$ and ground signal GND 320, and is controlled via switch control signal 214.

In embodiments, reference signals as described herein (e.g., reference signal inputs $106_0$-$106_{n-1}$) may include reference voltages, common mode signals, virtual ground signals, and/or the like. In embodiments with pluralities of reference signals, each reference signal of the plurality of reference signals may be the same signal, or may be one or more separate reference signals.

Input signal switches $302_0$-$302_{n-1}$ and reference signal switches $304_0$-$304_{n-1}$ are controlled by switch control signal 214 that may be generated by control component 112 of FIG. 1, and may be associated with an operating phase(s) of DVS circuit 400. Switch control signal 214 may include a respective control signal for each of input signal switches $302_0$-$302_{n-1}$ and reference signal switches $304_0$-$304_{n-1}$, and each switch may be controlled independently of the others. When active (i.e., closed) input signal switches $302_0$-$302_{n-1}$ and reference signal switches $304_0$-$304_{n-1}$ provide their respective outputs to signal buffers $306_0$-$306_{n-1}$, and when inactive (i.e., open) input signal switches $302_0$-$302_{n-1}$ and reference signal switches $304_0$-$304_{n-1}$ act as open circuits. As shown, switch control signal 214 includes phase control signals $\phi_1$ and $\phi_2$, respectively corresponding to a first phase and a second phase of operation. Each of input signal switches $302_0$-$302_{n-1}$ may receive a $\phi_1$ phase control signal and reference signal switches $304_0$-$304_{n-1}$ may receive a $\phi_2$ phase control signal.

Signal buffers $306_0$-$306_{n-1}$ may be implemented as any inverting or non-inverting analog signal buffer (e.g., operational amplifiers (op-amps)), according to various embodiments. Signal buffers $306_0$-$306_{n-1}$ may include an output and one or more inputs such as an inverting input terminal and/or a non-inverting input terminal Signal buffers $306_0$-$306_{n-1}$ may be implemented as one of a group or array of n distributed buffers as shown in FIG. 4.

Buffer feedback components $308_0$-$308_{n-1}$ may be implemented as any type of impedance element (e.g., a resistor or other impedance element) and are configured to provide feedback paths to set the gain for signal buffers $306_0$-$306_{n-1}$. The impedance of feedback components $308_0$-$308_{n-1}$ may be implemented according to design and/or gain preference. In some embodiment, buffer feedback components $308_0$-$308_{n-1}$ may include variation-matching switches as described above.

Capacitors $310_0$-$310_{n-1}$ may be implemented as any type of capacitor and may be implemented as one of a group or array of n distributed capacitors as shown. In embodiments, the bottom plates of capacitors $310_0$-$310_{n-1}$ are connected together as a node at signal representation 212. Capacitors $310_0$-$310_{n-1}$ are configured to receive signals from signal buffers $306_0$-$306_{n-1}$ respectively at their top plates, and to provide signal representation 212 to controller component 112 from their bottom plates.

Sampling switch 312 is controlled by switch control signal 214 that may be generated by control component 112 of FIG. 1, and may be associated with an operating phase(s) of DVS circuit 400. When active (i.e., closed) sampling switch 312 connects the bottom plate of capacitors $310_0$-$310_{n-1}$ to GND 320, and when inactive (i.e., open) sampling switch 312 acts as an open circuit. As shown, switch control signal 214 includes a phase control signal $\phi_3$ corresponding to a third phase of operation that may be used to activate and/or deactivate sampling switch 312.

Impedance elements $402_0$-$402_{n-1}$ and impedance elements $404_0$-$404_{n-1}$ may be implemented as any type of impedance element (e.g., a resistor or other impedance element). The impedances of impedance elements $402_0$-$402_{n-1}$ and impedance elements $404_0$-$404_{n-1}$ may be implemented according to design and/or gain preference. In various illustrative embodiments, impedance elements $402_0$-$402_{n-1}$ and impedance elements $404_0$-$404_{n-1}$ may or may not be shown.

The exemplary embodiments described in this Section may be used in SAR ADC and pipeline ADC implementations as described in the following Sections.

4. Example SAR ADC Embodiments

In embodiments, DVS circuits and/or components such as those described above are provided for SAR ADC systems. SAR ADCs may be configured in various ways, according to embodiments. As shown in FIG. 1, an SAR ADC system may include a DVS component (e.g., a DVS circuit) and a controller component. For instance, a DVS circuit may receive an analog input signal and provide an output to a controller component.

Figure 5:
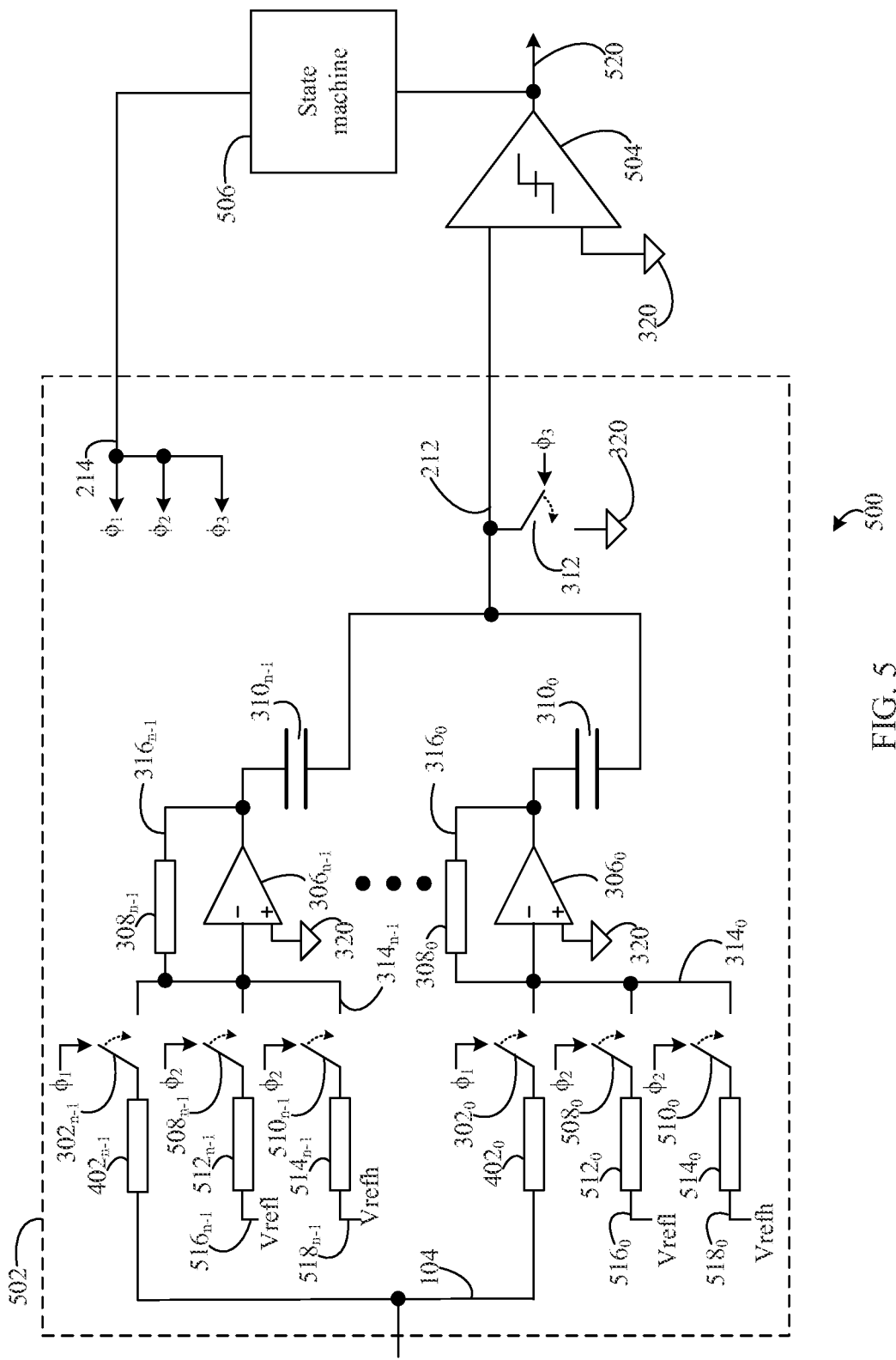
FIG. 5 is a circuit diagram of a portion of a SAR ADC system with distributed virtual-ground switching, according to an exemplary embodiment.

FIG. 5 shows a circuit diagram of a portion of an SAR ADC system 500 that utilizes DVS, according to an exemplary embodiment. Exemplary SAR ADC system 500 includes a DVS circuit 502, a comparator 504, and a state machine 506. In embodiments, comparator 504 and state machine 506 may comprise a controller component (e.g., controller component 112 of FIG. 1).

According to some embodiments, DVS circuit 502 may be a further embodiment of DVS circuit 400 of FIG. 4. As shown, DVS circuit 502 includes each of the same features as DVS circuit 400 with the following exceptions. DVS circuit 502 includes two pluralities of reference signal switches in place of reference signal switches $304_0$-$304_{n-1}$ of DVS circuit 400; specifically, DVS circuit 502 includes a plurality of first reference signal switches $508_0$-$508_{n-1}$ and a plurality of second reference signal switches $510_0$-$510_{n-1}$. DVS circuit 502 also includes two pluralities of impedance elements in place of impedance elements $404_0$-$404_{n-1}$ of DVS circuit 400; specifically, DVS circuit 502 includes a plurality of first impedance elements $512_0$-$512_{n-1}$ and a plurality of second impedance elements $514_0$-$514_{n-1}$. First reference signal switches $508_0$-$508_{n-1}$ respectively receive low reference signals Vrefl $516_0$-$516_{n-1}$ through first impedance elements $512_0$-$512_{n-1}$, and second reference signal switches $510_0$-$510_{n-1}$ respectively receive high reference signals Vrefh $518_0$-$518_{n-1}$ through second impedance elements $514_0$-$514_{n-1}$. Vrefl $516_0$-$516_{n-1}$ and Vrefh $518_0$-$518_{n-1}$ are respectively provided to signal buffers $306_0$-$306_{n-1}$ via first reference signal switches $508_0$-$508_{n-1}$ and second reference signal switches $510_0$-$510_{n-1}$. In embodiments, SAR ADC system 500 is configured for a differential signal implementation using Vrefl $516_0$-$516_{n-1}$ and Vrefh $518_0$-$518_{n-1}$ as low and high differential signal levels respectively, although other signal protocols and/or implementations are contemplated herein using fewer or additional reference signal inputs and corresponding impedance elements and/or switches.

DVS circuit 502 may provide signal representation 212 to a first input of comparator 504. Comparator 504 may also be connected to GND 320 via a second input. Comparator 504 may provide a digital output 520 to state machine 506 and to other components of circuits and systems in devices utilizing the described SAR ADC embodiments. State machine 506 receives digital output 520, and provides switch control signal 214 to DVS circuit 502.

DVS circuit 502 may be configured similarly, and operate similarly, as DVS circuit 400 with the above-noted differences.

First reference signal switches $508_0$-$508_{n-1}$ and second reference signal switches $510_0$-$510_{n-1}$ may be implemented as MOSFETs, as described herein, or as any other switching element. First reference signal switches $508_0$-$508_{n-1}$ and second reference signal switches $510_0$-$510_{n-1}$ may be controlled by switch control signal 214, and may be associated with operating phases of DVS circuit 502.

First impedance elements $512_0$-$512_{n-1}$, and second impedance elements $514_0$-$514_{n-1}$ may be implemented as any impedance element (e.g., as resistors or other impedance elements). The impedances of first impedance elements $512_0$-$512_{n-1}$, and second impedance elements $514_0$-$514_{n-1}$ may be implemented according to design and/or gain preference. In various illustrative embodiments, first impedance elements $512_0$-$512_{n-1}$, and second impedance elements $514_0$-$514_{n-1}$ may or may not be shown.

Comparator 504 may be implemented as any standard comparator element, and is configured to compare the voltage value of signal representation 212 to GND 320. Comparator 504 is configured to output a logical '1' (high) if the compared value is greater than GND 320, and to output a logical '0' (low) if the compared value is approximately equal to GND 320.

State machine 506 may comprise a memory (e.g., registers), state machine logic, a controller(s) or processor, and/or the like. State machine 506 is configured to store digital output 520 from comparator 504, and to provide switch control signal 214 corresponding to the received digital output 520. As noted above, an iterative SAR process for each of the n bits of a digital representation corresponding to a received analog input signal (e.g., analog input signal 104) may be performed according to embodiments. During each iteration (described in further detail below) the present value of digital output 520 may be stored in a memory or register of state machine 506 and a corresponding switch control signal 214 may be provided to DVS circuit 502 to control input signal switches $302_0$-$302_{n-1}$, first reference signal switches $508_0$-$508_{n-1}$, second reference signal switches $510_0$-$510_{n-1}$, and sampling switch 312.

As previously noted, in embodiments, reference signals as described herein (e.g., Vrefl $516_0$-$516_{n-1}$ and/or Vrefh $518_0$-$518_{n-1}$) may include reference voltages, common mode signals, virtual ground signals, and/or the like. Each reference signal of these pluralities of reference signals may be the same signal, or may be one or more separate reference signals.

5. Example Pipeline ADC Embodiments

In embodiments, DVS circuits and/or components such as those described above are provided for pipeline ADC systems. Pipeline ADCs may be configured in various ways, according to embodiments. As shown in FIG. 1, a pipeline ADC system may include a DVS component (or DVS circuit) and a controller component. A DVS circuit may receive an analog input signal and provide an output to a controller component.

Figure 6:
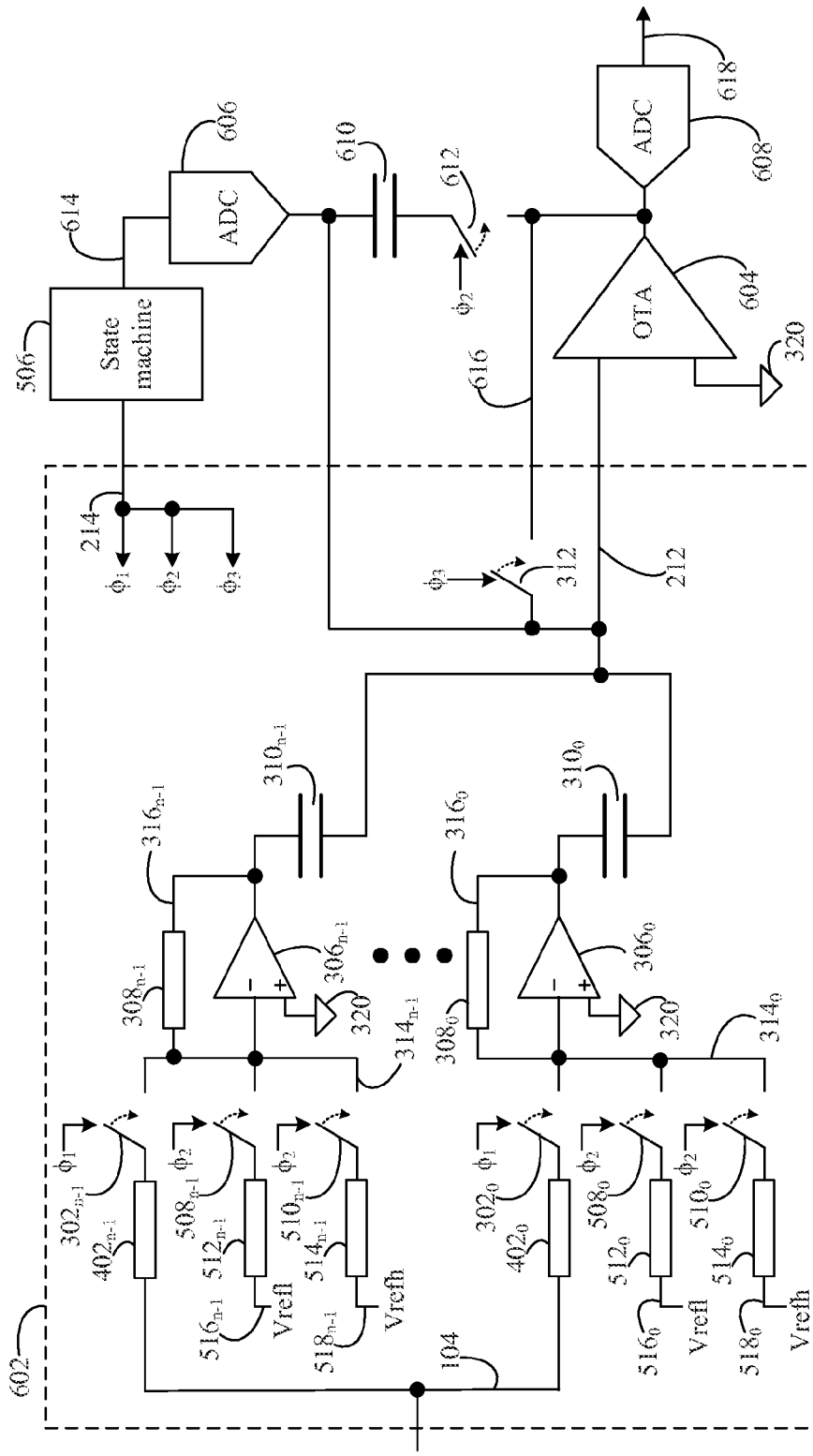
FIG. 6 is a circuit diagram of a portion of a pipeline ADC system with distributed virtual-ground switching, according to an exemplary embodiment.

FIG. 6 shows a circuit diagram of a portion of a pipeline ADC system 600 that utilizes DVS, according to an exemplary embodiment. Exemplary pipeline ADC system 600 includes a DVS circuit 602, an OTA 604, a first ADC 606, a second ADC 608, and state machine 506. In embodiments, OTA 604, first ADC 606, a second ADC 608, and state machine 506 may comprise a controller component (e.g., controller component 112 of FIG. 1). In the embodiment illustrated, pipeline ADC system 600 also includes an ADC capacitor 610 and an ADC switch 612, which may also be included as part of the controller component.

According to some embodiments, DVS circuit 602 may be a further embodiment of DVS circuit 502 of FIG. 5. As shown, DVS circuit 602 includes each of the same features as DVS circuit 502 with the following exceptions. DVS circuit 602 includes sampling switch 312, as in DVS circuit 502, however in DVS circuit 602 sampling switch 312 is connected between the signal representation 212 and the input of second ADC 608, as shown in FIG. 6.

DVS circuit 602 may provide signal representation 212 to a first input of OTA 604, to the input of first ADC 606, and to the input of second ADC 608 through sampling switch 312, as illustrated. First ADC 606 provides a first digital ADC output 614 to state machine 506 which in turn provides switch control signal 214 to DVS circuit 602. OTA 604 may also be connected to GND 320 through a second input. OTA 604 may provide an OTA output 616 to the input of second ADC 608. The top plate of ADC capacitor 610 may be connected to the input of first ADC 606 and to signal representation 212, and the bottom plate of ADC capacitor 610 may be connected to the first terminal of ADC switch 612. The second terminal of ADC switch 612 may be connected to OTA output 616, to the input of second ADC 608, and to sampling switch 312, as shown. A second digital ADC output 618 is provided from second ADC 608 to other components of circuits and systems in devices utilizing the described pipeline ADC embodiments.

DVS circuit 602 may be configured similarly, and operate similarly, as DVS circuit 502 with the above-noted differences.

OTA 604 may be implemented as a standard OTA element. OTA 604 may be configured as a voltage controlled current source with its output being OTA output 616. In embodiments, OTA 604 may be configured as a differential OTA with a first differential input of signal representation 212 and a second differential signal input of GND 320.

State machine 506, as included in pipeline ADC system 600, may be similarly configured as described above with respect to FIG. 5. As shown in FIG. 6, state machine 506 receives a first digital signal from first ADC 606 instead of digital output 520 as illustrated in FIG. 5.

First ADC 606 and second ADC 608 may be implemented as any standard analog-to-digital converter(s), and are each configured to convert their respective input signals into digital outputs.

ADC capacitor 610 may be implemented as any type of capacitor, and ADC switch 612 may be implemented as any standard switching element and/or similarly as any switching element described herein (e.g., as a MOSFET). ADC switch 612 may be configured to be controlled by switch control signal 214, as described herein, and as shown in FIG. 6, ADC switch 612 may be associated with a phase of operation of pipeline ADC system 600 (e.g., phase $\phi_2$).

6. Example DVS Circuit Variation Embodiments

As noted herein, DVS circuits and systems may be configured to perform their functions in various ways. In this Section, embodiments for variations of the DVS examples described herein are provided.

Figure 7:
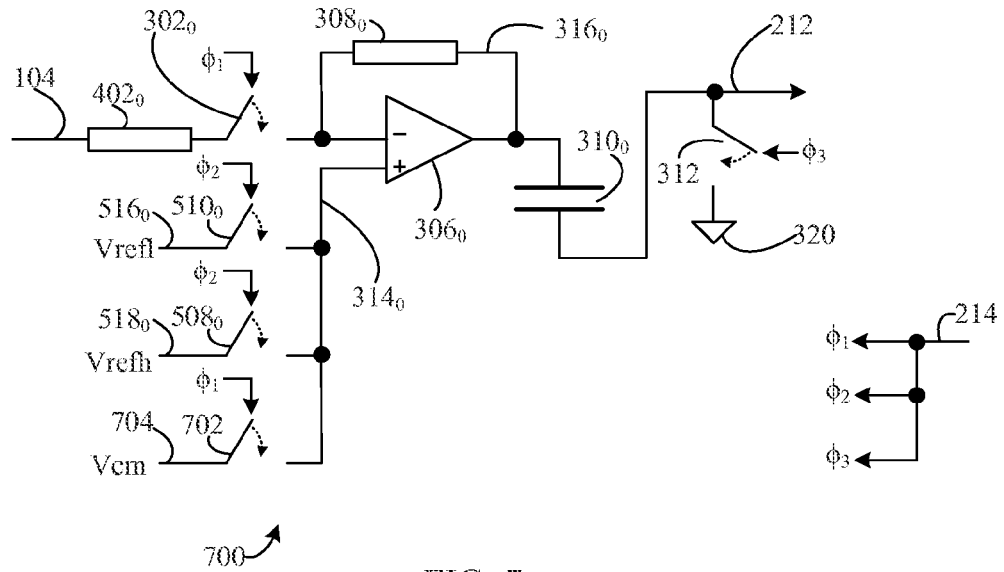
FIG. 7 is a circuit diagram of a distributed virtual-ground switching circuit variation, according to an exemplary embodiment.

For example, FIG. 7 shows a circuit variation 700 of DVS circuit 300 of FIG. 3 and of a distributed replica buffer 306 as illustrated in DVS circuit 400 of FIG. 4, SAR ADC system 500 of FIG. 5, and pipeline ADC system 600 of FIG. 6, according to an embodiment. While multiple reference signals are illustrated by way of example, any number of reference signals (e.g., as described in one or more other embodiments) may be included according to the embodiments described in this section. For instance, the three reference signal inputs provided to the signal buffer in circuit variation 700 are provided to the non-inverting input of the signal buffer rather than to the inverting input. As shown, circuit variation 700 also includes a common mode (CM) reference signal Vcm 704 that may be provided to signal buffer $306_0$ via a CM reference signal switch 702 that may be controlled by phase $\phi_1$ of switch control signal 214, as described herein.

In an embodiment, as noted, each of the reference switches can be placed on the non-inverting input side of the signal buffer. For example, as shown in FIG. 7, analog input signal 104 may be received by signal buffer $306_0$ at its inverting input, while Vrefl $516_0$, Vrefh $518_0$, and Vcm 704 are each received at the non-inverting input of signal buffer $306_0$. In such a configuration, the feedback factor for signal buffer $306_0$ is higher in the conversion phase, and signal buffer $306_0$ (e.g., implemented as an op-amp) may be configured to tolerate a larger input CM range.

Figure 8:
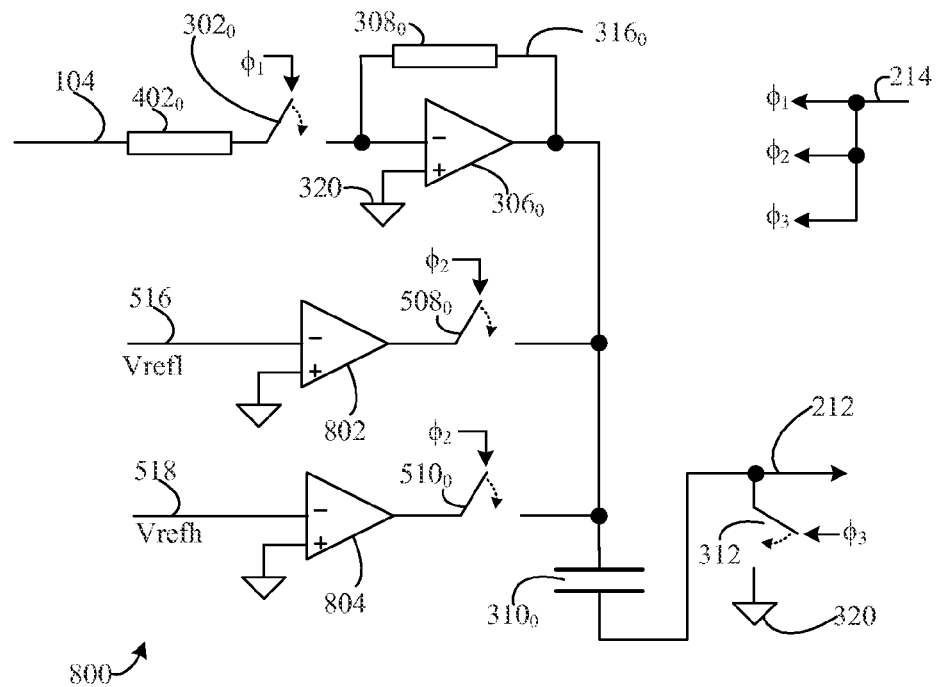
FIG. 8 is a circuit diagram of a distributed virtual-ground switching circuit variation, according to an exemplary embodiment.

FIG. 8 shows a circuit variation 800 of DVS circuit 300 of FIG. 3 and of a distributed replica buffer 306 as illustrated in DVS circuit 400 of FIG. 4, SAR ADC system 500 of FIG. 5, and pipeline ADC system 600 of FIG. 6, according to an embodiment. Circuit variation 800 includes two reference signals (Vrefl 516 and Vrefh 518) that are not provided to distributed buffers (e.g., signal buffers $306_0$-$306_{n-1}$ with signal buffer $306_0$ shown in FIG. 8), but rather through individual, undistributed buffers 802 and 804 respectively. In other words, while there may be n replica signal buffers $306_0$-$306_{n-1}$ in embodiments, as shown in FIG. 8 an undistributed buffer may be used for each of the reference signal inputs. Additionally, the reference signals may be configured to drive the capacitors (e.g., capacitors $310_0$-$310_{n-1}$, with capacitor $310_0$ shown in FIG. 8) directly in a conversion phase of operation (e.g., phase $\phi_2$) through first reference signal switch $508_0$ (first reference signal switches $508_1$-$508_{n-1}$, not shown) and second reference signal switch $510_0$ (second reference signal switches $510_1$-$510_{n-1}$, not shown) respectively. In such embodiments, the undistributed buffers 802 and 804 may be powered down and switched to a high impedance configuration during the conversion phase. Such a configuration allows a low power reference scheme to save power and eliminates the gain matching requirements associated with distributed buffers. In embodiments, the outputs of undistributed buffer 802 and undistributed buffer 804 can be set to high impedance in phase $\phi_2$ by shorting the output PMOS and NMOS gates to VDD and GND 320, respectively.

Thus in embodiments, circuit variation 800 of FIG. 8 may be used in conjunction with the inclusion of an input switch at the input side of the signal buffer, and the signal buffer output is prevented from interfering with the top plate voltage of the capacitors when the bottom plates are switched to different reference voltages.

As noted above, in embodiments further DVS circuit variations may be implemented by including switches in the feedback paths for signal buffers to account for gain matching requirements associated with distributed buffers and their respective switches.

7. Example Operational Embodiments

Figure 9:
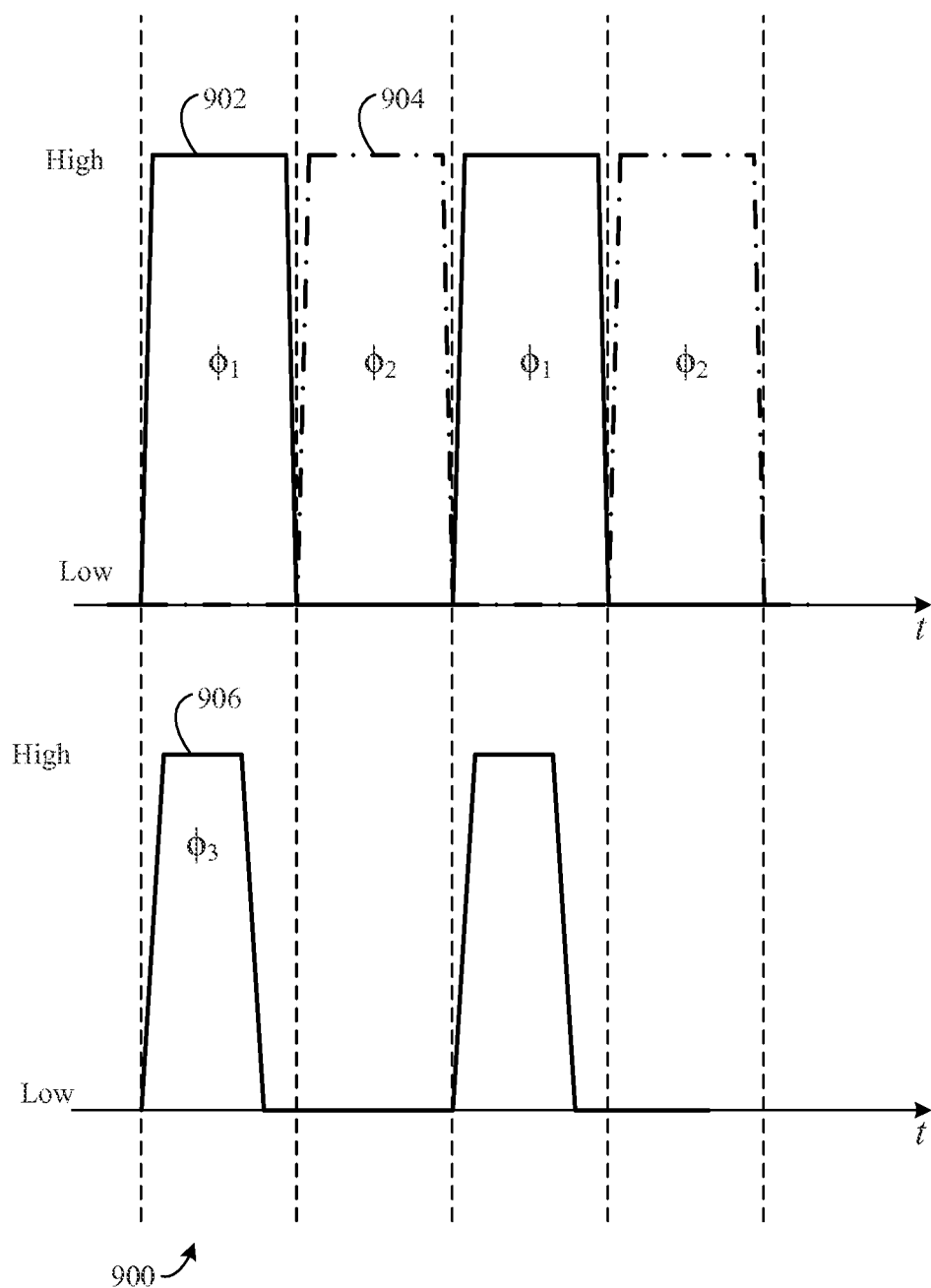
FIG. 9 is a phase diagram for operation of distributed virtual-ground switching systems and circuits, according to an exemplary embodiment.

Systems and circuits utilizing DVS as described herein may, without limitation, perform their functions according to the exemplary operational embodiments described in this Section. For instance, FIG. 9 shows a phase diagram 900 for exemplary operation of distributed virtual-ground switching systems and circuits. Three phases of operation, a tracking phase: phase $\phi_1$ 902, a conversion phase: phase $\phi_2$ 904, and a sampling phase: phase $\phi_3$ 906, that may be used according to embodiments described herein are shown in phase diagram 900 with respect to time t. As previously described, phase $\phi_1$ 902, phase $\phi_2$ 904, and phase $\phi_3$ 906 may each be included in switch control signal 214, and may be provided separately to individual switches, or groups thereof, as a control signal. In embodiments, phase $\phi_3$ 906 may be at least partially overlapping with phase $\phi_1$ 902 and/or phase $\phi_2$ 904, and as illustrated, phase $\phi_3$ 906 may transition from active ("high") to inactive ("low") before phase $\phi_1$ 902 transitions from active to inactive. When phase $\phi_3$ 906 is low, the bottom plates of DVS capacitors may be sampled as sampling switch 312 is open and inactive, e.g., as illustrated in FIGS. 5 and 6.

In exemplary operation, during phase $\phi_1$ 902 an analog input signal may be received by one or more signal buffers as described herein. Phase $\phi_1$ 902 is configured to control switches associated with analog input signals, such as input signal switches $302_0$-$302_{n-1}$. Thus, during the tracking phase, the phase $\phi_1$ 902 portion of switch control signal 214 may activate switches associated with analog input signals by being "high." During tracking in phase $\phi_1$ 902, the bottom plates of DVS capacitors (e.g., capacitors $310_0$-$310_{n-1}$ of FIGS. 4-6) may be connected to GND 320 via sampling switch 312 during the beginning of phase $\phi_1$ 902, and may be disconnected from GND 320 via sampling switch 312 before the end of phase $\phi_1$ 902 corresponding to phase $\phi_3$ 906. Accordingly, the DVS capacitors will hold a charge substantially equal to the analog input signal after being disconnected from GND 320 during the tracking phase. While tracking, reference switches are deactivated according to the phase $\phi_2$ 904 portion of switch control signal 214 being "low."

During the conversion phase, corresponding to phase $\phi_2$ 904, the switches associated with analog input signals are deactivated according to the phase $\phi_1$ 902 portion of switch control signal 214 being "low." Phase $\phi_2$ 904 is configured to control reference switches, such as reference switches $304_0$-$304_{n-1}$, and reference switches $504_0$-$504_{n-1}$, described above. Thus, during the conversion phase, the phase $\phi_2$ 2904 portion of switch control signal 214 may activate reference switches by being "high." In embodiments, this allows one or more reference signals to be received by the signal buffers and subsequently by the DVS capacitors.

It should be noted that for purposes of illustrative clarity, the example phases are described such that switches being controlled by a given phase are activated (i.e., a closed switch) while the phase signals are "high" and are deactivated (i.e., an open switch) while the phase signals are "low." However, in various embodiments switches may be configured to be controlled by in "active low" implementations.

Figure 10:
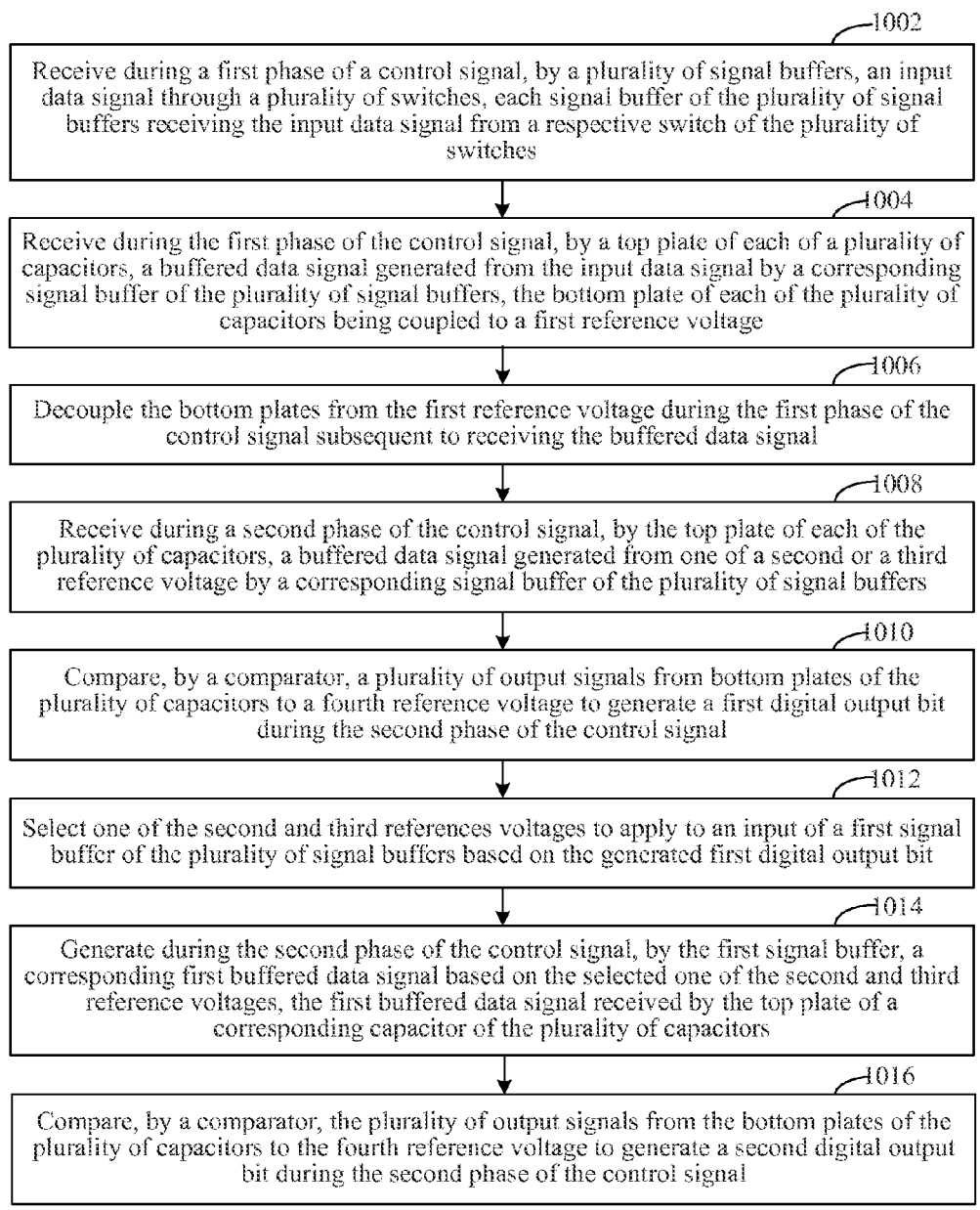
FIGS. 10-11 are flowcharts providing example steps for operation of virtual-ground switching systems and circuits, according to an exemplary embodiment.

Turning now to FIG. 10, a flowchart 1000 providing example steps for operation of virtual-ground switching systems and circuits is shown. System 100 of FIG. 1, system 200 of FIG. 2, DVS circuit 300 of FIG. 3, DVS circuit 400 of FIG. 4, SAR ADC system 500 of FIG. 5, pipeline ADC system 600 of FIG. 6, circuit variation 800 of circuit variation 800 of FIG. 8, and/or any of their respective components and sub-components may operate in accordance with flowchart 1000, in embodiments. Other structural and operational embodiments will be apparent to persons skilled in the relevant art(s) based on the discussion regarding flowchart 1000. Flowchart 1000 is described as follows.

Flowchart 1000 begins with step 1002. At step 1002, an input data signal is received during a first phase of a control signal, by a plurality of signal buffers, through a plurality of switches, each signal buffer of the plurality of signal buffers receiving the input data signal from a respective switch of the plurality of switches. For example, referring to FIG. 5, analog input signal 104 may be received during the tracking phase, phase $\phi_1$, of switch control signal 214 (e.g., phase $\phi_1$ 902 of FIG. 9) by signal buffers $306_0$-$306_{n-1}$ through input signal switches $302_0$-$302_{n-1}$. Each of signal buffers $306_0$-$306_{n-1}$ receives analog input 104 via input signal switches $302_0$-$302_{n-1}$ respectively.

At step 1004, a buffered data signal generated from the input data signal by a corresponding signal buffer of the plurality of signal buffers is received during the first phase of the control signal, by a top plate of each of a plurality of capacitors, the bottom plate of each of the plurality of capacitors being coupled to a first reference voltage. For example, referring to FIG. 5, analog input signal 104 may be buffered by signal buffers $306_0$-$306_{n-1}$ and respectively provided as buffer outputs $316_0$-$316_{n-1}$ during phase $\phi_1$ of switch control signal 214 by respective top plates of capacitors $310_0$-$310_{n-1}$. Respective bottom plates of capacitors $310_0$-$310_{n-1}$ may be coupled to GND 320 through sampling switch 312 during phase $\phi_3$ of switch control signal 214 (e.g., phase $\phi_3$ 906 of FIG. 9).

At step 1006, the bottom plates are decoupled from the first reference voltage during the first phase of the control signal subsequent to receiving the buffered data signal. For example, each bottom plate of capacitors $310_0$-$310_{n-1}$ of FIGS. 4-6 may be decoupled from GND 320 by sampling switch 312 (e.g., opening) during phase $\phi_3$.

At step 1008, a buffered data signal generated from one of a second or a third reference voltage by a corresponding signal buffer of the plurality of signal buffers is received during a second phase of the control signal, by the top plate of each of the plurality of capacitors. For instance, referring to FIG. 5, in the conversion phase, phase $\phi_2$ of switch control signal 214 (e.g., phase $\phi_2$ 2904 of FIG. 9), first reference switches $508_0$-$508_{n-1}$ and/or second reference switches $510_0$-$510_{n-1}$ may be activated to respectively provide reference signals Vrefl $516_0$-$516_{n-1}$ and/or Vrefh $518_0$-$518_{n-1}$ to signal buffers $306_0$-$306_{n-1}$ which subsequently respectively provide the buffered reference signals Vrefl $516_0$-$516_{n-1}$ and/or Vrefh $518_0$-$518_{n-1}$ as buffer outputs $316_0$-$316_{n-1}$ to the top plates of capacitors $310_0$-$310_{n-1}$. In embodiments, reference switch $510_{n-1}$ and reference switches $508_0$-$508_{n-1}$ may be activated by phase $\phi_2$ of switch control signal 214 at step 1008. Accordingly, the top plates of capacitors $310_0$-$310_{n-1}$ are charged to 0V, and the bottom plates of capacitors $310_0$-$310_{n-1}$ are charged to a voltage corresponding to an inverted analog input signal 104.

Note that in an embodiment, all of signal buffers $306_0$-$306_{n-1}$ may be provided with the same one of the second and third reference voltage (e.g., all provided with reference signals Vrefl $516_0$-$516_{n-1}$) in step 1008, until one of the second or third reference signals is iteratively selected to be provided to each of signal buffers $306_0$-$306_{n-1}$, one by one, in step 1012 below.

At step 1010, a plurality of output signals from bottom plates of the plurality of capacitors are compared, by a comparator, to a fourth reference voltage to generate a first digital output bit during the second phase of the control signal. For instance, referring to FIG. 5, in phase $\phi_2$ of switch control signal 214, signals (collectively corresponding to the inverted analog input signal 104) of the bottom plates of capacitors $310_0$-$310_{n-1}$ are combined in a single node: signal representation 212. Signal representation 212 may be provided to comparator 504 and may be compared to GND 320 to generate comparator output 520, a first digital bit representation of a portion of analog input signal 104.

At step 1012, one of the second and third references voltages are selected to apply to an input of a first signal buffer of the plurality of signal buffers based on the generated first digital output bit. For instance, referring again to FIG. 5, in phase $\phi_2$ of switch control signal 214, state machine 506 may, based on the generated comparator output 520 of step 1010, provide phase $\phi_2$ to first reference switches $508_0$-$508_{n-1}$ and/or second reference switches $510_0$-$510_{n-1}$ to provide corresponding Vrefl $516_0$-$516_{n-1}$ and/or Vrefh $518_0$-$518_{n-1}$ to signal buffers $306_0$-$306_{n-1}$.

At step 1014, a corresponding first buffered data signal is generated during the second phase of the control signal, by the first signal buffer, based on the selected one of the second and third reference voltages, the first buffered data signal received by the top plate of a corresponding capacitor of the plurality of capacitors. For example, as shown in FIG. 5, the reference signals provided to signal buffers $306_0$-$306_{n-1}$ in step 1012 may be buffered and then provided to the top plates of capacitors $310_0$-$310_{n-1}$ according to phase $\phi_2$.

At step 1016, the plurality of output signals from the bottom plates of the plurality of capacitors are compared, by the comparator, to the fourth reference voltage to generate a second digital output bit during the second phase of the control signal. For instance, referring to FIG. 5, in phase $\phi_2$, signals (collectively corresponding to a portion of the inverted analog input signal 104) of the bottom plates of capacitors $310_0$-$310_{n-1}$ are again combined in a single node: signal representation 212. Signal representation 212 may be provided to comparator 504 and may be compared to GND 320 to generate comparator output 520, a second digital bit representation of a portion of analog input signal 104.

In some example embodiments, one or more of steps 1002, 1004, 1006, 1008, 1010, 1012, 1014 and/or 1016 of flowchart 1000 may not be performed. Moreover, steps in addition to or in lieu of steps 1002, 1004, 1006, 1008, 1010, 1012, 1014, and/or 1016 of flowchart 1000 may be performed (some of which were described above). Further, in some example embodiments, one or more of steps 1002, 1004, 1006, 1008, 1010, 1012, 1014, and/or 1016 of flowchart 1000 may be performed out of the order shown in FIG. 10, in an alternate sequence, and/or partially (or completely) concurrently with other steps.

Figure 11:
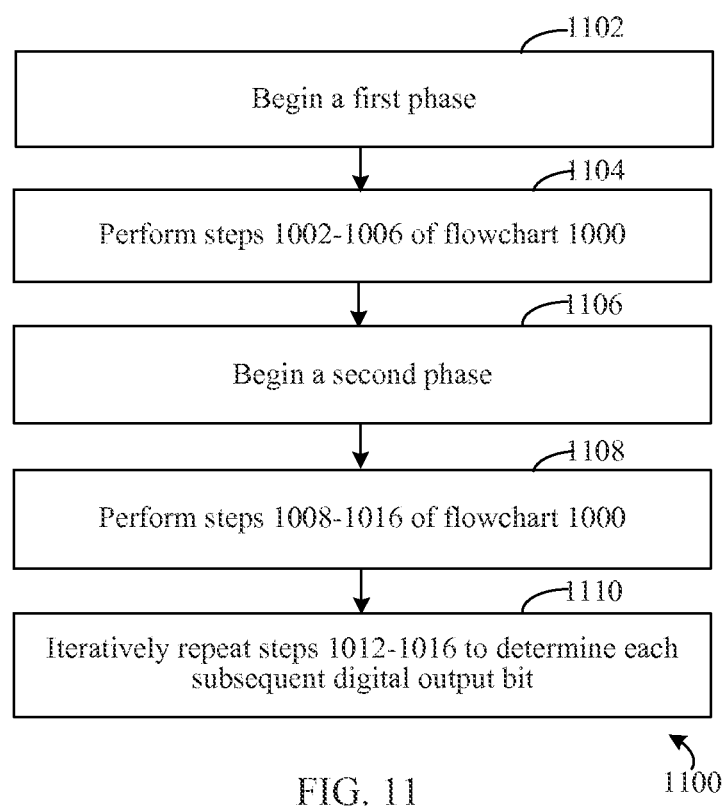

FIG. 11 shows a flowchart 1100 providing example operational steps for one or more embodiments of DVS circuits and systems described herein. System 100 of FIG. 1, system 200 of FIG. 2, DVS circuit 300 of FIG. 3, DVS circuit 400 of FIG. 4, SAR ADC system 500 of FIG. 5, pipeline ADC system 600 of FIG. 6, circuit variation 800 of circuit variation 800 of FIG. 8, and/or any of their respective components and sub-components may operate in accordance with flowchart 1100 of FIG. 11, in embodiments. Other structural and operational embodiments will be apparent to persons skilled in the relevant art(s) based on the discussions regarding flowchart 1100 of FIG. 11. Flowchart 1100 is described as follows.

Flowchart 1100 begins with step 1102. At step 1102, a first phase is begun. For example, operational phase $\phi_1$ (e.g., phase $\phi_1$ 902 of FIG. 9) may begin and/or activate at step 1102.

At step 1104, steps 1002-1006 of flowchart 1000 are performed.

At step 1106, a second phase is begun. For example, operational phase $\phi_2$ (e.g., phase $\phi_2$ 904 of FIG. 9) may begin and/or activate at step 1106.

At step 1108, steps 1008-1016 of flowchart 1000 are performed.

At step 1110, steps 1012-1016 are iteratively repeated to determine each subsequent digital output bit. For example, in embodiments with an n-bit digital representation of an analog input signal, a first bit of the digital representation may be generated at step 1010, a reference signal is selected to provide to the signal buffer in step 1012, a buffered signal is generated by the second signal buffer in step 1014, and a second bit of the digital representation may be generated at step 1016. On the next iteration, steps 1012-1016 may be repeated (e.g., a reference signal is selected for a next signal buffer in step 1012, a buffered signal is generated by the next signal buffer in step 1014) to determine the next bit of the n-bit digital representation in step 1016, and subsequent iterations may be used determine subsequent bits up to and including the $n^{th}$ bit.

8. Further DVS Example Embodiments and Advantages

The embodiments described herein provide for SAR ADCs and pipeline ADCs using DVS techniques. Embodiments may be configured to perform according to differential signaling, or other known signaling protocols. The described embodiments may be applicable across a wide range of technologies and products that utilize ADCs such as, but not limited to, communication systems (data and/or voice), communication devices, computing devices, electronic devices, and/or the like.

It will be recognized that the DVS circuits and systems, their respective components, and/or the techniques described herein may be implemented in hardware, or in hardware combined with one or both of software and/or firmware, such as being implemented as hardware logic/electrical circuitry. The disclosed technologies can be put into practice using hardware implementations other than those described herein. Any hardware (optionally plus software/firmware) implementations suitable for performing the functions described herein can be used.

9. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A circuit that comprises:
   a virtual-ground switching system that includes:
   a first capacitor having a first top plate and a first bottom plate, the first capacitor being configured to drive an output signal from the first bottom plate;
   a first switch having a first terminal configured to receive an input signal and having a second terminal configured to provide the input signal according to a control signal; and
   a first signal buffer having a first output terminal communicatively coupled to the first top plate and having a first input terminal communicatively coupled to the second terminal of the first switch.

2. The circuit of claim 1, wherein the circuit further comprises:
   a second switch having a third terminal and a fourth terminal, the second switch being configured to receive a reference signal at the third terminal and to provide the reference signal from the fourth terminal;
   wherein the fourth terminal is communicatively coupled to the first input terminal of the first signal buffer.

3. The circuit of claim 2, wherein the first switch is configured to provide the input signal to the first signal buffer during a first phase of the control signal; and
   wherein the second switch is configured to provide a reference signal to the first signal buffer during a second phase of the control signal.

4. The circuit of claim 3, wherein the first switch includes a first activation terminal configured to receive a signal indicative of the first phase of the control signal; and
   wherein the second switch includes a second activation terminal configured to receive a signal indicative of the second phase of the control signal.

5. The circuit of claim 3, wherein the reference signal comprises at least one reference voltage signal.

6. The circuit of claim 1, wherein the first input terminal of the first signal buffer is an inverting input terminal; and
   wherein the circuit further comprises:
   at least one reference switch, each reference switch having a third terminal and a fourth terminal, and being configured to receive a respective reference voltage signal at each third terminal and to provide the respective reference voltage signal from each fourth terminal;
   wherein each fourth terminal of each reference switch is communicatively coupled to a second input terminal of the first signal buffer that is a non-inverting input terminal.

7. The circuit of claim 1, wherein the circuit further comprises:
   a sampling switch that comprises:
   a ground terminal communicatively coupled to a ground voltage;
   a plate terminal communicatively coupled to the first bottom plate; and
   a sample activation terminal configured to open and close the sampling switch;
   wherein the sampling switch is configured to receive a signal indicative of a third phase of the control signal and a fourth phase of the control signal at the sample activation terminal, and is configured to provide the output signal during the third phase of the control signal, and to provide a ground voltage signal during the fourth phase of the control signal.

8. The circuit of claim 7, wherein the circuit further comprises:
a second switch having a third terminal and a fourth terminal, the second switch being configured to receive a reference signal at the third terminal and to provide the reference signal from the fourth terminal, the fourth terminal being communicatively coupled to the first input terminal;
a second capacitor having a second top plate and a second bottom plate, the second capacitor being configured to drive the output signal from the second bottom plate, the plate terminal and the first bottom plate being communicatively coupled to the second bottom plate;
a third switch having a fifth terminal configured to receive the input signal and having a sixth terminal configured to provide the input signal;
a second signal buffer having a second output terminal communicatively coupled to the second top plate, and having a second input terminal communicatively coupled to the sixth terminal; and
a fourth switch having a seventh terminal and an eighth terminal, the fourth switch being configured to receive the reference signal at the seventh terminal, and to provide the reference signal from the eighth terminal, the eighth terminal being communicatively coupled to the second input terminal.

9. The circuit of claim 1, wherein the circuit further comprises:
a second switch having a third terminal and a fourth terminal, the second switch being configured to receive a first reference signal at the third terminal and to provide the reference signal from the fourth terminal, wherein the fourth terminal is communicatively coupled to a second input terminal of the first signal buffer; and
a third switch having a fifth terminal and a sixth terminal, the third switch being configured to receive a second reference signal at the fifth terminal and to provide the reference signal from the sixth terminal, wherein the sixth terminal is communicatively coupled to the second input terminal of the first signal buffer.

10. The circuit of claim 9, wherein the first reference signal is a first differential reference signal;
wherein the second reference signal is a second differential reference signal; and
wherein the first signal buffer comprises an operational amplifier.

11. The circuit of claim 1, wherein the circuit further comprises:
a second switch having a third terminal and a fourth terminal, the second switch being configured to receive a first reference signal at the third terminal and to provide the reference signal from the fourth terminal, wherein the third terminal is communicatively coupled to an output terminal of a second signal buffer, and the fourth terminal is communicatively coupled to the first top plate; and
a third switch having a fifth terminal and a sixth terminal, the third switch being configured to receive a second reference signal at the fifth terminal and to provide the reference signal from the sixth terminal, wherein the fifth terminal is communicatively coupled to an output terminal of a third signal buffer, and the sixth terminal is communicatively coupled to the first top plate.

12. The circuit of claim 11, wherein the first reference signal is a first differential reference signal;
wherein the second reference signal is a second differential reference signal; and
wherein the first signal buffer comprises an operational amplifier that is configured to be in a high-impedance state when the second switch or the third switch is closed.

13. A system that comprises:
a capacitor array, each capacitor of the capacitor array having a top plate and having a bottom plate configured to drive an output signal;
a plurality of switch groups, each switch group corresponding to a respective capacitor of the capacitor array, and including:
a first switch configured to provide an input signal;
a second switch configured to provide a first reference voltage signal; and
a third switch configured to provide a second reference voltage signal; and
a signal buffer array, each signal buffer of the signal buffer array corresponding to a respective capacitor of the capacitor array and to a respective switch group of the plurality of switch groups, each signal buffer including:
an output terminal communicatively coupled to the top plate of the corresponding respective capacitor; and
a first input terminal communicatively coupled to each switch of the corresponding respective switch group.

14. The system of claim 13, wherein the system further comprises:
a comparator that comprises:
a comparator output terminal;
a first comparator input terminal communicatively coupled to the bottom plate of each capacitor of the capacitor array; and
a second comparator input terminal communicatively coupled to a ground voltage.

15. The system of claim 14, wherein the system further comprises:
a controller that comprises:
a controller input terminal communicatively coupled to the comparator output terminal;
a controller output terminal communicatively coupled to each switch of the plurality of switch groups;
a memory configured to store digital signals received from the comparator output terminal; and
a processing component configured to determine a control signal value to be provided from the controller output terminal, the control signal value based at least in part on a digital signal of the digital signals received from the comparator output terminal.

16. The system of claim 13, wherein the system further comprises:
an operational transconductance amplifier (OTA) that comprises:
an amplifier output terminal;
a first amplifier input terminal communicatively coupled to the bottom plate of each capacitor of the capacitor array; and
a second amplifier input terminal communicatively coupled to a ground voltage.

17. The system of claim 16, wherein the system further comprises:
a first analog-to-digital converter (ADC) that includes a first ADC input terminal communicatively coupled to the first amplifier input terminal, and includes a first ADC output terminal communicatively coupled to the first switch and the second switch of each of the plurality of switch groups; and
a second ADC that includes a second ADC input terminal communicatively coupled to the amplifier output terminal, and includes a second ADC output terminal configured to provide a digital representation of the output signal.

18. The system of claim 17, wherein the system further comprises:
a controller that comprises:
a controller input terminal communicatively coupled to the first ADC output terminal;
a controller output terminal communicatively coupled to each switch of the plurality of switch groups;
a memory configured to store digital signals received from the first ADC output terminal; and
a processing component configured to determine a control signal value to be provided from the controller output terminal, the control signal value based at least in part on a digital signal of the digital signals received from the first ADC output terminal.

19. The system of claim 13, wherein the capacitor array comprises n capacitors and includes a first capacitor corresponding to a least significant bit associated with the input signal and a last capacitor corresponding to a most significant bit associated with the input signal,
wherein the first capacitor of the capacitor array has a first capacitance $C_0$, and
wherein each successive capacitor of the capacitor array is configured to have a respective capacitance approximately equal to $2^{(i-1)}C_0$, for i=1 to n; and
wherein each signal buffer of the signal buffer array corresponding to a respective capacitor of the capacitor array is scaled according to a ratio of $C_i/\Sigma C_{0\ldots n-1}$, where $C_i$ is the capacitance of its corresponding respective capacitor and $\Sigma C_{0\ldots n-1}$ is the sum of the capacitances of all capacitors in the capacitor array.

20. A method, comprising:
receiving during a first phase of a control signal, by a plurality of signal buffers, an input data signal through a plurality of switches, each signal buffer of the plurality of signal buffers receiving the input data signal from a respective switch of the plurality of switches;
receiving during the first phase of the control signal, by a top plate of each of a plurality of capacitors, a buffered data signal generated from the input data signal by a corresponding signal buffer of the plurality of signal buffers, the bottom plate of each of the plurality of capacitors being coupled to a first reference voltage;
decoupling the bottom plates from the first reference voltage during the first phase of the control signal subsequent to receiving the buffered data signal;
receiving during a second phase of the control signal, by the top plate of each of the plurality of capacitors, a buffered data signal generated from one of a second or a third reference voltage by a corresponding signal buffer of the plurality of signal buffers;
comparing, by a comparator, a plurality of output signals from bottom plates of the plurality of capacitors to a fourth reference voltage to generate a first digital output bit during the second phase of the control signal;
selecting one of the second and third references voltages to apply to an input of a first signal buffer of the plurality of signal buffers based on the generated first digital output bit;
generating during the second phase of the control signal, by the first signal buffer, a corresponding first buffered data signal based on the selected one of the second and third reference voltages, the first buffered data signal received by the top plate of a corresponding capacitor of the plurality of capacitors; and
comparing, by the comparator, the plurality of output signals from the bottom plates of the plurality of capacitors to the fourth reference voltage to generate a second digital output bit during the second phase of the control signal.

* * * * *